United States Patent
Yu et al.

(10) Patent No.: US 7,341,933 B2
(45) Date of Patent: Mar. 11, 2008

(54) METHOD FOR MANUFACTURING A SILICIDED GATE ELECTRODE USING A BUFFER LAYER

(75) Inventors: Shaofeng Yu, Plano, TX (US); Haowen Bu, Plano, TX (US); Jiong-Ping Lu, Richardson, TX (US); Lindsey Hall, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 63 days.

(21) Appl. No.: 11/007,569

(22) Filed: Dec. 8, 2004

(65) Prior Publication Data
US 2006/0121713 A1   Jun. 8, 2006

(51) Int. Cl.
*H01L 21/3205* (2006.01)

(52) U.S. Cl. ............... 438/592; 438/664; 257/E21.203
(58) Field of Classification Search ........... 438/592, 438/664; 257/E21.203
See application file for complete search history.

(56) References Cited

U.S. PATENT DOCUMENTS

| | | | |
|---|---|---|---|
| 6,376,320 B1 * | 4/2002 | Yu | 438/303 |
| 6,555,453 B1 * | 4/2003 | Xiang et al. | 438/581 |
| 6,586,332 B1 * | 7/2003 | Lee | 438/656 |
| 2002/0197805 A1 * | 12/2002 | Kwon et al. | 438/305 |

* cited by examiner

*Primary Examiner*—Chandra Chaudhari
(74) *Attorney, Agent, or Firm*—W. James Brady, III; Frederick J. Telecky, Jr.

(57) ABSTRACT

The present invention provides a method for manufacturing a semiconductor device and a method for manufacturing an integrated circuit. The method for manufacturing the semiconductor device, among other steps, includes providing a capped polysilicon gate electrode (290) over a substrate (210), the capped polysilicon gate electrode (290) including a buffer layer (260) located between a polysilicon gate electrode layer (250) and a protective layer (270). The method further includes forming source/drain regions (710) in the substrate (210) proximate the capped polysilicon gate electrode (290), removing the protective layer (270) and the buffer layer (260), and siliciding the polysilicon gate electrode layer (250) to form a silicided gate electrode (1110).

20 Claims, 8 Drawing Sheets

METHOD FOR MANUFACTURING A SILICIDED GATE ELECTRODE USING A BUFFER LAYER

TECHNICAL FIELD OF THE INVENTION

The present invention is directed, in general, to a method for manufacturing a semiconductor device, and more specifically to a method for manufacturing a silicided gate electrode using a buffer layer and a method for manufacturing an integrated circuit including the same.

BACKGROUND OF THE INVENTION

Metal gate electrodes are currently being investigated to replace polysilicon gate electrodes in today's ever shrinking and changing transistor devices. One of the principal reasons the industry is investigating replacing the polysilicon gate electrodes with metal gate electrodes is in order to solve problems of poly-depletion. Traditionally, a polysilicon gate electrode with an overlying silicide was used for the gate electrodes in CMOS devices. However, as device feature size continues to shrink, poly depletion becomes a serious issue when using polysilicon gate electrodes.

Accordingly, metal gates have been proposed. However, in order to optimize the performance of CMOS devices, the metal gates need dual tunable work functions. For instance, the metal gates need tunable work functions for NMOS and PMOS devices similar to present polysilicon gate technology, requiring the work functions of metal gates to range from 4.1~4.4 eV for NMOS and 4.8~5.1 eV for PMOS (see, B. Cheng, B. Maiti, S. Samayedam, J. Grant, B. Taylor, P. Tobin, J. Mogab, *IEEE Intl. SOI Conf. Proc.*, pp. 91-92, 2001).

Recently, silicided metal gates have been investigated based on the extension of existing self-aligned silicide (SALICIDE) technology. In this approach, polysilicon is deposited over the gate dielectric. A metal is deposited over the polysilicon and reacted to completely consume the polysilicon resulting in a fully silicided metal gate, rather than a deposited metal gate. The silicided metal gate provides a metal gate with the least perturbation to the conventional process, and avoids contamination issues. Furthermore, poly doping has been shown to affect the work function of the silicided metal gates.

The silicided metal gates are not without their problems. One of the more recognizable problems associated with the silicided metal gates may be attributed to the difficulty in evenly and consistently fully siliciding the silicided metal gates. It has been observed in various prior art devices that the silicided metal gates do not have a consistent silicidation across the thickness of the metal gate across the wafer. This, as one would expect, at a very minimum would lead to inconsistent electrical properties for the silicided metal gates, and in extreme situations, device failure.

Accordingly, what is needed is a method for manufacturing silicided metal gate structures that does not experience the drawbacks of the prior art methods.

SUMMARY OF THE INVENTION

To address the above-discussed deficiencies of the prior art, the present invention provides a method for manufacturing a semiconductor device and a method for manufacturing an integrated circuit. The method for manufacturing the semiconductor device, among other steps, includes providing a capped polysilicon gate electrode over a substrate, the capped polysilicon gate electrode including a buffer layer located between a polysilicon gate electrode layer and a protective layer. The method further includes forming source/drain regions in the substrate proximate the capped polysilicon gate electrode, removing the protective layer and the buffer layer, and siliciding the polysilicon gate electrode layer to form a silicided gate electrode.

In another embodiment, the present invention provides a method for manufacturing an integrated circuit. In this aspect of the present invention, the method includes forming semiconductor devices over the substrate as described above, and forming interconnects within dielectric layers located over the substrate for electrically contacting the semiconductor devices.

The foregoing has outlined preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention.

BRIEF DESCRIPTION OF THE DRAWINGS

The invention is best understood from the following detailed description when read with the accompanying Figs. It is emphasized that in accordance with the standard practice in the semiconductor industry, various features are not drawn to scale. In fact, the dimensions of the various features may be arbitrarily increased or reduced for clarity of discussion. Reference is now made to the following descriptions taken in conjunction with the accompanying drawings, in which.

DETAILED DESCRIPTION

The present invention is based in part on the recognition that a substantially smooth and clean top surface of a polysilicon gate electrode layer is needed before depositing a silicidation metal thereon and converting the polysilicon gate electrode layer to a silicided gate electrode. Specifically, the present invention has recognized that sacrificial layers, such as protective layers used on the top surface of the polysilicon gate electrode layer prior to the formation of the silicided metal tend to negatively affect the smoothness and cleanness of the top surface of the polysilicon gate electrode layer. For example, in many instances, portions of the sacrificial layer will remain on the top surface of the polysilicon gate electrode layer, thus being located between the silicidation metal and the polysilicon gate electrode layer. It is believed that these remaining sacrificial layer portions tend to make it difficult to obtain a fully silicided gate electrode, as desired in the art.

Given this recognition, the present invention acknowledged that a thin buffer layer could be placed between the sacrificial layer and the polysilicon gate electrode layer, the thin buffer layer substantially reducing the aforementioned issue. In an exemplary embodiment, the buffer layer comprises a material that is highly selective to the process used to remove the sacrificial layer, as well as comprises a material whose etch is highly selective to the polysilicon gate electrode layer located therebelow. With the use of the buffer layer, as well as the selectivity, it is believed that a substantially smooth and clean upper surface of the polysilicon gate electrode layer may be obtained before forming the silicidation metal thereon, and thereby forming a silicided gate electrode. Thus, the use of the buffer layer substantially reduces, if not eliminates, many of the problems associated with fully siliciding the silicided gate electrode.

Figure 1:
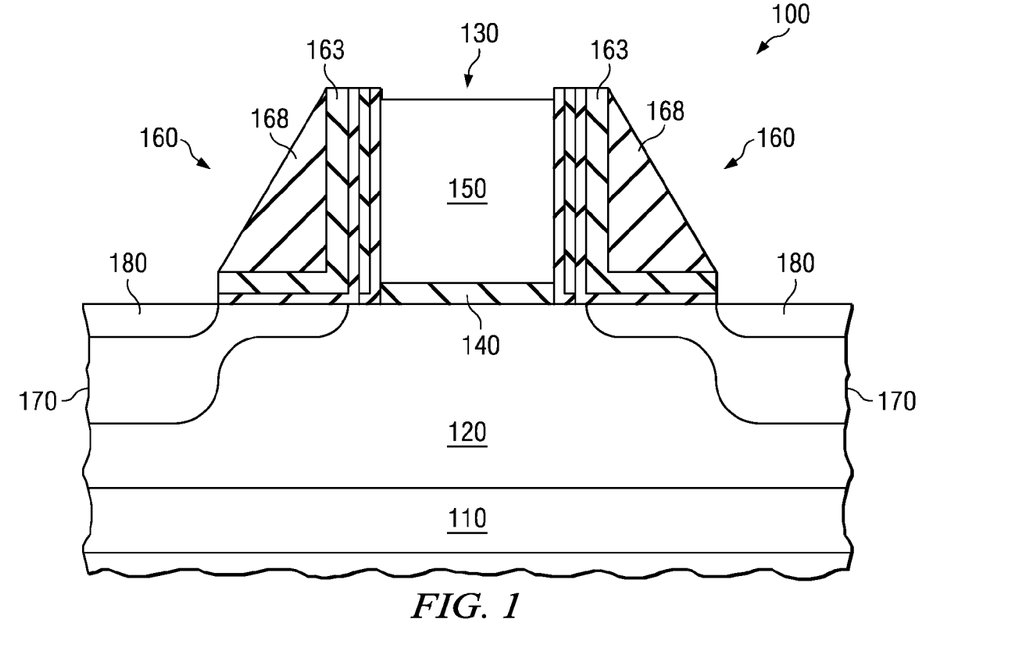
FIG. 1 illustrates a cross-sectional view of one embodiment of a semiconductor device constructed according to the principles of the present invention.

Referring initially to FIG. 1, illustrated is a cross-sectional view of one embodiment of a semiconductor device 100 constructed according to the principles of the present invention. In the embodiment illustrated in FIG. 1, the semiconductor device 100 includes a substrate 110. Located within the substrate 110 in the embodiment of FIG. 1 is a well region 120. Additionally located over the substrate 110 and well region 120 is a gate structure 130.

The gate structure 130 illustrated in FIG. 1 includes a gate oxide 140 located over the substrate 110, as well as a silicided gate electrode 150 located over the gate oxide 140. While the silicided gate electrode is illustrated in FIG. 1 as a fully silicided gate electrode, those skilled in the art understand that the silicided gate electrode 150 could also comprise a partially silicided gate electrode, where only the top portion of the electrode is silicided. This embodiment might be used if there was a need to reduce the contact resistance of the silicided gate electrode 150.

The silicided gate electrode 150 may have a variety of thicknesses; nonetheless, a thickness ranging from about 50 nm to about 150 nm is exemplary. The silicided gate electrode 150, when constructed in accordance with the principles of the present invention, may comprise a number of different materials. For instance, in the illustrative embodiment shown in FIG. 1 the silicided gate electrode 150 includes nickel, thus forming a nickel silicided, however, it is envisioned that the silicided gate electrode 150 could alternatively include cobalt, platinum, titanium, tantalum, molybdenum, tungsten, etc., while staying within the scope of the present invention.

In an exemplary embodiment of the present invention, the silicided gate electrode 150 has a consistent silicidation across a given thickness level thereof. That is, at a given thickness level across the width or length of the silicided gate electrode 150, the silicided gate electrode 150 will either be or not be silicided. Limited, if any at all, situations exist where for a given thickness level across the width or length of the silicided gate electrode 150 both silicided and non-silicided regions exist. This unique feature is substantially related to the advantageous method for manufacturing the semiconductor device 100 covered by the present invention, which in one embodiment includes the use of a buffer layer between the polysilicon gate electrode layer and the protective layer.

The silicided gate electrode 150 may also include a dopant or combination of several types of dopants therein. The dopant, such as boron, phosphorous, arsenic or another similar dopant based on whether the semiconductor device 100 is operating as a PMOS device or an NMOS device, is configured to tune the minimum energy required to bring an electron from the Fermi level to the vacuum level, or the so called work function.

The gate structure 130 further contains gate sidewall spacers 160 flanking both sides of the silicided gate electrode 150 and gate oxide 140. The gate sidewall spacers 160 in the embodiment of FIG. 1 each include a number of different layers. For instance the gate sidewall spacers 160, among other layers, each include L-shaped nitride spacers 163 and sidewall oxides 168. In this particular embodiment, the L-shaped nitride spacers 163 comprise a unique nitride layer that includes carbon. The carbon content may be within a wide range, however, it is believed that a carbon content ranging from about 5% to about 10% is advantageous. The other layers, among other materials, could include a collection of oxides and nitrides. The gate sidewall spacers 160 may comprise many different types and numbers of layers while staying consistent with the principles of the present invention.

The semiconductor device 100 illustrated in FIG. 1 additionally includes conventional source/drain regions 170 located within the substrate 110 and proximate the gate oxide 140. Located within the source/drain regions 170 are silicided source/drain regions 180. In one advantageous embodiment, the silicided source/drain regions 180 act as source/drain contact regions as well as blocking layers to function as a protectant from the silicidation material used to form the silicided gate electrode 150.

Figure 2:
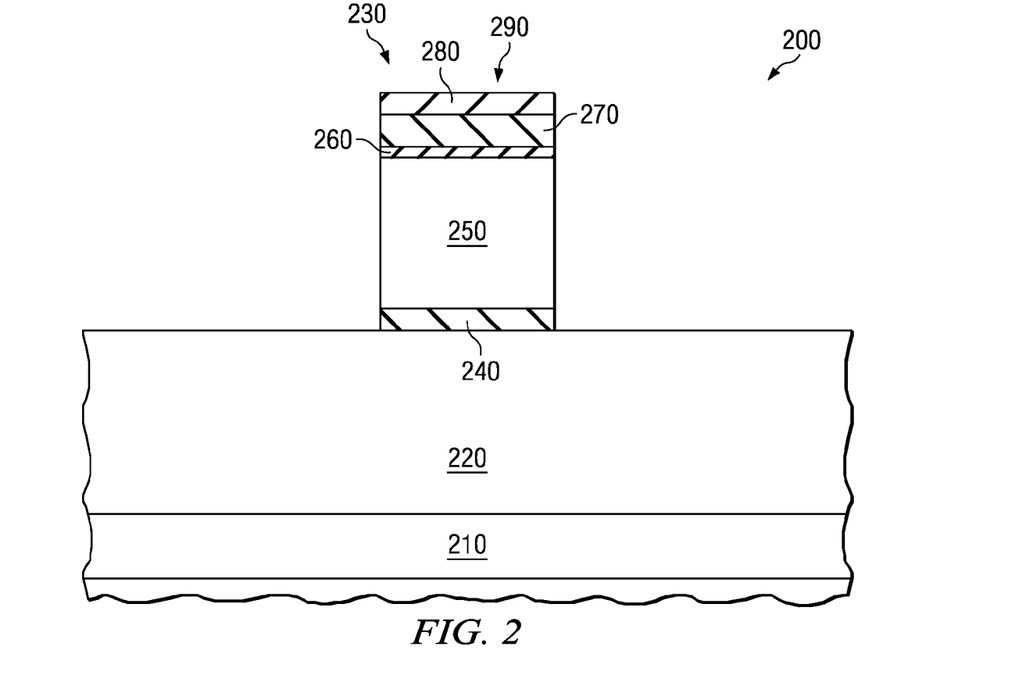
FIG. 2 illustrates a cross-sectional view of a partially completed semiconductor device manufactured in accordance with the principles of the present invention.

Turning now to FIGS. 2-11, illustrated are cross-sectional views of detailed manufacturing steps instructing how one might, in an advantageous embodiment, manufacture a semiconductor device similar to the semiconductor device 100 depicted in FIG. 1. FIG. 2 illustrates a cross-sectional view of a partially completed semiconductor device 200 manufactured in accordance with the principles of the present invention. The partially completed semiconductor device 200 of FIG. 2 includes a substrate 210. The substrate 210 may, in an exemplary embodiment, be any layer located in the partially completed semiconductor device 200, including a wafer itself or a layer located above the wafer (e.g., epitaxial layer). In the embodiment illustrated in FIG. 2, the substrate 210 is a P-type substrate; however, one skilled in the art understands that the substrate 210 could be an N-type substrate without departing from the scope of the present invention. In such a case, each of the dopant types described throughout the remainder of this document would be reversed. For clarity, no further reference to this opposite scheme will be discussed.

Located within the substrate 210 in the embodiment shown in FIG. 2 is a well region 220. The well region 220, in light of the P-type semiconductor substrate 210, would more than likely contain an N-type dopant. For example, the well region 220 would likely be doped by ion implantation of an N-type dopant with a dose ranging from about 1E13 atoms/cm$^2$ to about 1E14 atoms/cm$^2$ and at an energy ranging from about 100 keV to about 500 keV. This results in the well region 220 having a peak dopant concentration ranging from about 5E17 atoms/cm$^3$ to about 1E19 atoms/cm$^3$.

Located over the substrate 210 in the embodiment of FIG. 2 is a gate structure 230. The gate structure 230 includes a gate oxide 240 and a polysilicon gate electrode layer 250. The gate oxide 240 may comprise a number of different materials and stay within the scope of the present invention. For example, the gate oxide 240 may comprise silicon dioxide, or in an alternative embodiment comprise a high dielectric constant (K) material. In the illustrative embodiment of FIG. 2, however, the gate oxide 240 is a silicon dioxide layer having a thickness ranging from about 0.5 nm to about 5 nm, and more specifically a thickness ranging from about 1 nm to about 3 nm.

Any one of a plurality of manufacturing techniques could be used to form the gate oxide 240. For example, the gate oxide 240 may be either grown or deposited. Additionally, the growth or deposition steps may require a significant number of different temperatures, pressures, gasses, flow rates, etc.

While the advantageous embodiment of FIG. 2 dictates that the polysilicon gate electrode layer 250 comprises standard polysilicon, other embodiments exist where the polysilicon gate electrode layer, or at least a portion thereof, comprises amorphous polysilicon. The amorphous polysilicon embodiment may be particularly useful when a substantially planar upper surface of the polysilicon gate electrode layer 250 is desired.

The deposition conditions for the polysilicon gate electrode layer 250 may vary, however, if the polysilicon gate electrode layer 250 were to comprise standard polysilicon, such as the instance in FIG. 2, the polysilicon gate electrode layer 250 could be deposited using a pressure ranging from about 100 torr to about 300 torr, a temperature ranging from about 620° C. to about 700° C., and a SiH$_4$ or Si$_2$H$_6$ gas flow ranging from about 50 sccm to about 150 sccm. If, however, amorphous polysilicon were desired, the amorphous polysilicon gate electrode layer could be deposited using a pressure ranging from about 100 torr to about 300 torr, a temperature ranging from about 450° C. to about 550° C., and a SiH$_4$ or Si$_2$H$_6$ gas flow ranging from about 100 sccm to about 300 sccm. In any instance, the polysilicon gate electrode layer 250 desirably has a thickness ranging from about 50 nm to about 150 nm.

The partially completed semiconductor device 200 illustrated in FIG. 2 also includes a buffer layer 260 located over a top surface of the polysilicon gate electrode layer 250. In an advantageous embodiment, the buffer layer 260 has a thickness ranging from about 0.5 nm to about 10 nm and is located directly on the top surface of the polysilicon gate electrode layer 250. While the thickness of the buffer layer 260 may vary, it is important that its thickness be sufficient to protect the polysilicon gate electrode layer 250 from subsequent etch processes, however, be thin enough to allow dopants to be implanted therethrough, as well as thin enough as to not subject other regions of the semiconductor device 200 to too much of its etch process during the removal thereof.

The buffer layer 260 may comprise a number of different materials while staying within the scope of the present invention. In one advantageous embodiment, the buffer layer 260 comprises a deposited or grown oxide, however, other embodiments exist where the material of the buffer layer 260 is selected from the group of materials including SiC, SiOC, SiON, SiCN, another similar material, or any combinations thereof. Of importance, however, is the etch selectivity of the buffer layer 260 to the protective layer 270 and polysilicon gate electrode layer 250.

The partially completed semiconductor device 200 illustrated in FIG. 2 further includes a protective layer 270 located over the buffer layer 260. In one advantageous embodiment, the protective layer 270 is located directly on the buffer layer 260. The protective layer 270, which may comprise silicon nitride among other materials, may have a thickness ranging from about 5 nm to about 50 nm. It is desirable for the protective layer 270 to have a thickness small enough to allow a dopant to easily penetrate therethrough, however, large enough to provide the sufficient amount of protection to the polysilicon gate electrode layer 250.

Optionally located over the protective layer 270 is a silicon dioxide layer 280. The optional silicon dioxide layer 280 is designed to help pattern the gate oxide 240, polysilicon gate electrode layer 250, buffer layer 260 and protective layer 270. With that said, those skilled in the art understand that the gate oxide 240, polysilicon gate electrode layer 250, buffer layer 260, protective layer 270 and optional silicon dioxide layer 280 were originally blanket deposited. Those blanket layers were subsequently patterned resulting in the gate oxide 240, polysilicon gate electrode layer 250, buffer layer 260, protective layer 270 and optional silicon dioxide layer 280 illustrated in FIG. 2. One skilled in the art understands the changes that may need to be made to the etch process used to define the gate oxide 240, polysilicon gate electrode layer 250, buffer layer 260, protective layer 270 and optional silicon dioxide layer 280 gate structure to accommodate the buffer layer 260. What finally results, in a capped polysilicon gate electrode 290.

Figure 3:
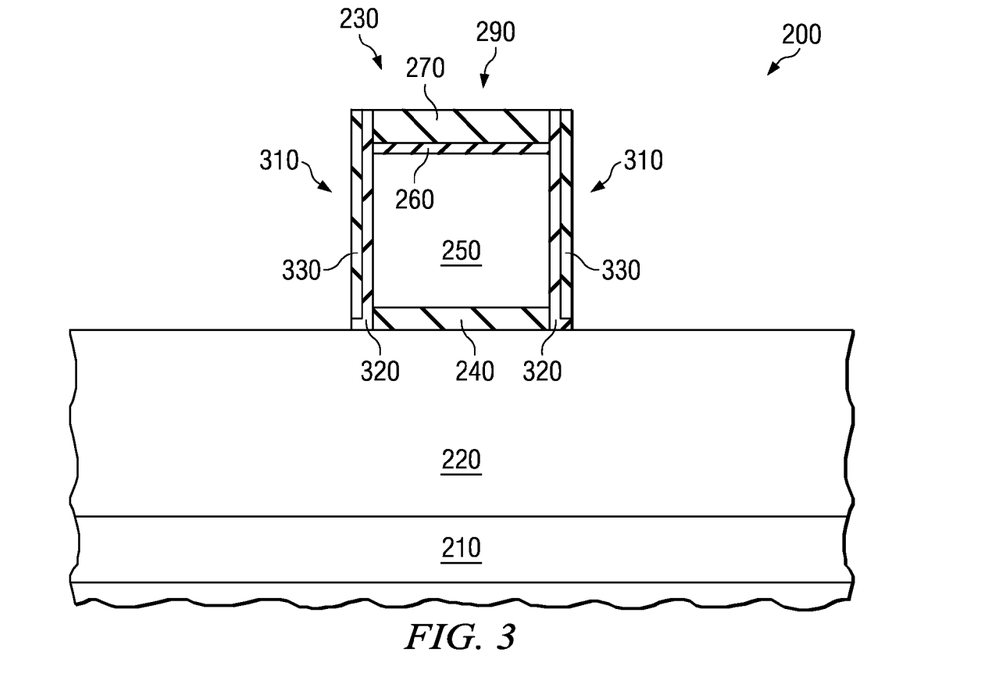
FIG. 3 illustrates a cross-sectional view of the partially completed semiconductor device illustrated in FIG. 2 after formation of portions of gate sidewall spacers.

Turning briefly to FIG. 3 illustrated is a cross-sectional view of the partially completed semiconductor device 200 illustrated in FIG. 2 after formation of portions of gate sidewall spacers 310. The portions of the gate sidewall spacers 310 shown in FIG. 3 include an oxide layer 320 and an offset nitride spacer 330. The oxide layer 320, as compared to similar layers used in the prior art, is formed at least partially using a deposition process. In an exemplary process the oxide layer 320 is initially formed using a first deposition process, and then finished using a second oxidation process. The first deposition process allows the oxide layer 320 to form on the top and sidewalls of the protective layer 270. In an alternative embodiment the entire oxide layer 320 is deposited.

The offset nitride spacer 330 may comprise a standard silicon nitride spacer or a silicon nitride layer having carbon therein. If the offset nitride spacer 330 were to contain the carbon, the carbon might form from about 5% to about 10% of the layer. While the oxide layer 320 and the offset nitride spacer 330 are shown located only along the sides of the gate structure 230, those skilled in the art are aware that the layers were previously blanket formed and subsequently anisotropically etched to form the oxide layer 320 and the offset nitride spacer 330.

Figure 4:
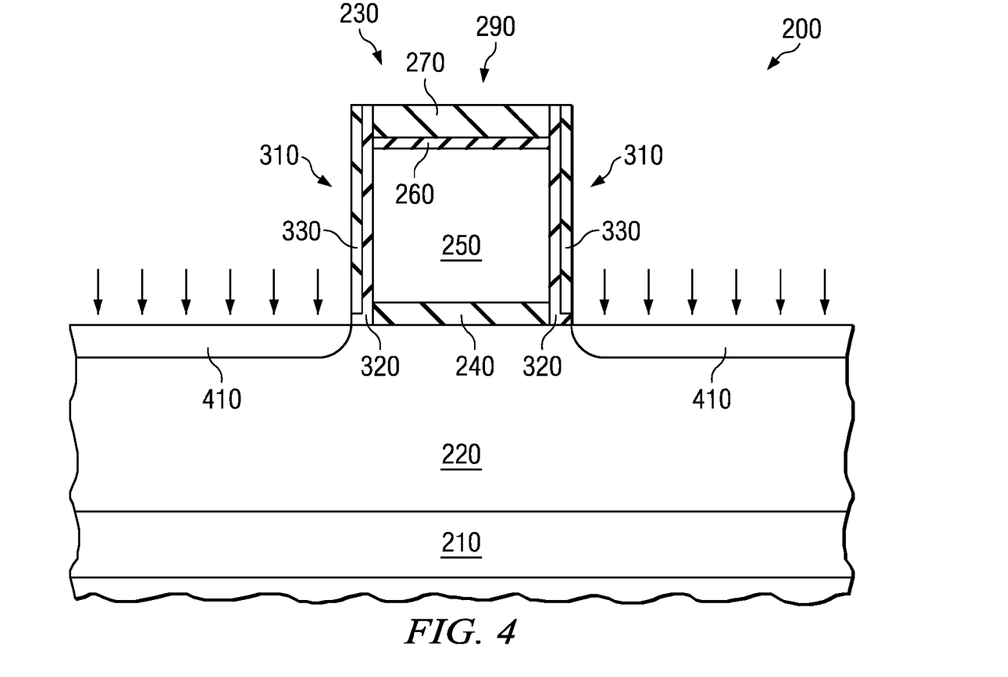
FIG. 4 illustrates a cross-sectional view of the partially completed semiconductor device illustrated in FIG. 3 after formation of extension implants within the substrate.

Turning now to FIG. 4, illustrated is a cross-sectional view of the partially completed semiconductor device 200 illustrated in FIG. 3 after formation of extension implants 410 within the substrate 210. The extension implants 410 are conventionally formed and generally have a peak dopant concentration ranging from about 1E19 atoms/cm$^3$ to about 2E20 atoms/cm$^3$. As is standard in the industry, the extension implants 410 have a dopant type opposite to that of the well region 220 they are located within. Accordingly, the extension implants 410 are doped with a P-type dopant in the illustrative embodiment shown in FIG. 4.

Figure 5:
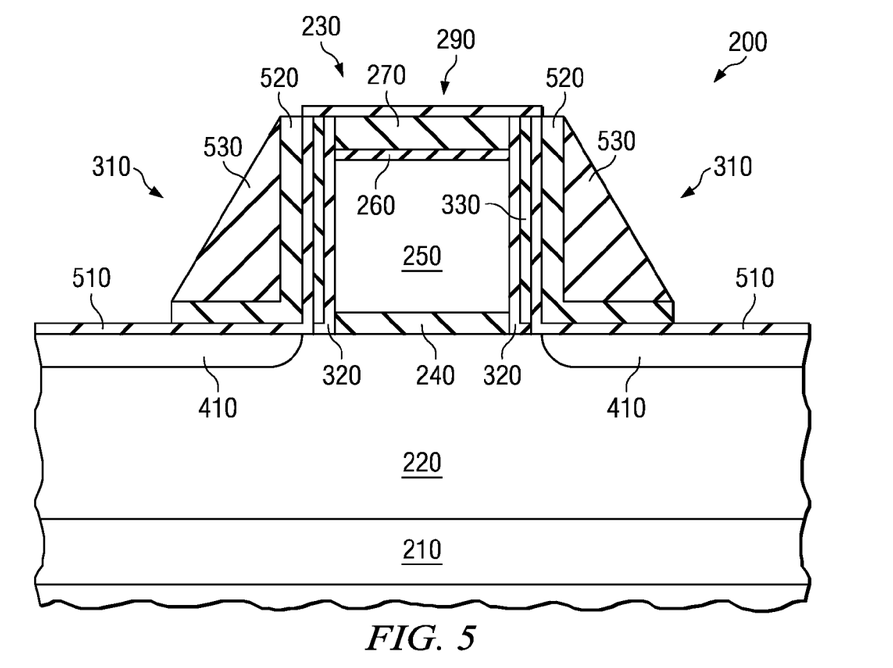
FIG. 5 illustrates a cross-sectional view of the partially completed semiconductor device illustrated in FIG. 4 after forming the remaining portions of the gate sidewall spacers.

Turning now to FIG. 5, illustrated is a cross-sectional view of the partially completed semiconductor device 200 illustrated in FIG. 4 after forming the remaining portions of the gate sidewall spacers 310. Particularly, a cap oxide 510, L-shaped nitride spacers 520 and sidewall oxides 530 complete the gate sidewall spacers 310. The cap oxide 510, among other purposes, has the job of preventing the L-shaped nitride spacers 520 from directly contacting the substrate 210. Most likely, the cap oxide 510 will be deposited over the partially completed semiconductor device 200 using a process similar to that used to form the oxide layer 320.

The L-shaped nitride spacers 520 may comprise any type of nitride, however, in an exemplary embodiment the L-shaped nitride spacers 520 comprise a nitride material that includes carbon. The carbon content, which may range from about 5% to about 10% of the L-shaped nitride spacers 520, is included within the L-shaped nitride spacers 520 to change the rate at which they etch. In the embodiment where the L-shaped nitride spacers 520 include carbon, the L-shaped nitride spacers 520 may be deposited using bis t-butylaminosilane (BTBAS) and ammonia (NH$_3$) precursors in a CVD reactor. Advantageously, the carbon causes the L-shaped nitride spacers 520 to etch at a slower rate than a traditional nitride layer. In an exemplary situation, after having been annealed using a temperature ranging from about 1000° C. to about 1100° C., the carbon causes the L-shaped nitride spacers 520 to have an etch selectivity of about 50:1 when compared to the traditional nitride layer.

The sidewall oxides 530 that are located over the L-shaped nitride spacers 520 are conventional. In the given embodiment of FIG. 5, the sidewall oxides 530 were blanket deposited and then subjected to an anisotropic etch. The resulting sidewall oxides 530 complete the gate sidewall spacers 310 illustrated in the embodiment of FIG. 5.

Figure 6:
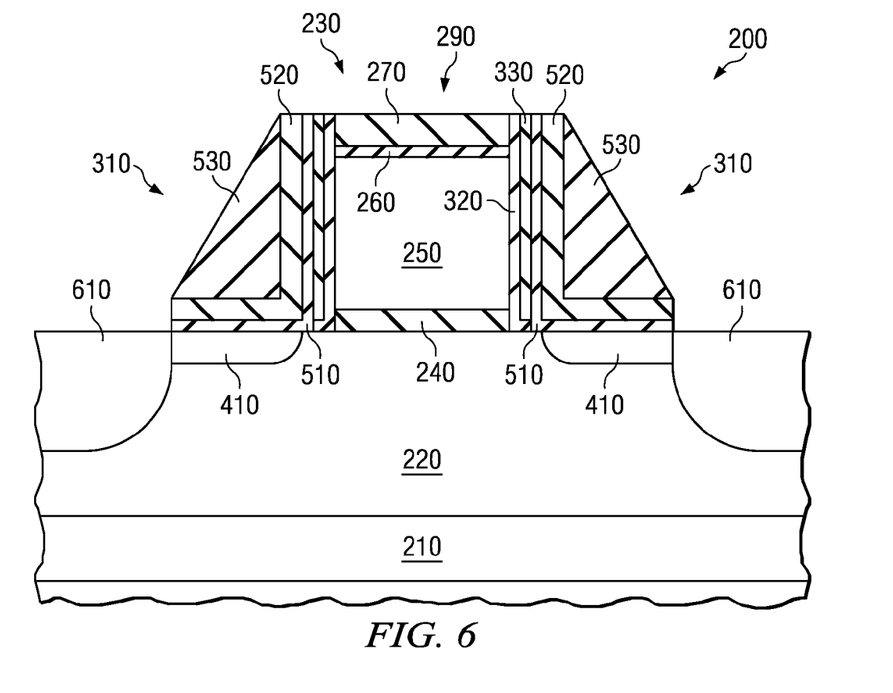
FIG. 6 illustrates a cross-sectional view of the partially completed semiconductor device illustrated in FIG. 5 after etching the cap oxide from the top of the substrate and top of the protective layer, as well as after formation of highly doped source/drain implants within the substrate.

Turning now to FIG. 6, illustrated is a cross-sectional view of the partially completed semiconductor device 200 illustrated in FIG. 5 after etching the cap oxide 510 from the top of the substrate 210 and top of the protective layer 270, as well as after formation of highly doped source/drain implants 610 within the substrate 210. Those skilled in the art understand the conventional processes that could be used to etch the cap oxide 510.

The formation of the highly doped source/drain implants 610 is also conventional. Generally the highly doped source/drain implants 610 have a peak dopant concentration ranging from about 1E18 atoms/cm$^3$ to about 1E21 atoms/cm$^3$. Also, the highly doped source/drain implants 610 should typically have a dopant type opposite to that of the well region 220 they are located within. Accordingly, in the illustrative embodiment shown in FIG. 6, the highly doped source/drain implants 610 are doped with a P-type dopant.

Figure 7:
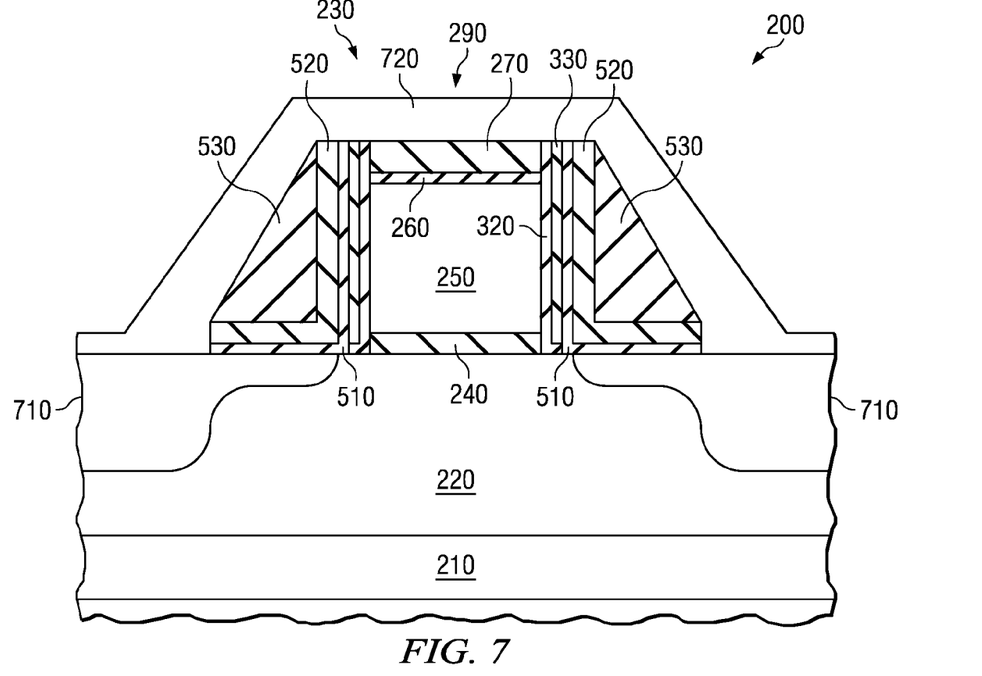
FIG. 7 illustrates a cross-sectional view of the partially completed semiconductor device illustrated in FIG. 6 after subjecting the semiconductor device to a standard source/drain anneal, thereby activating source/drain regions.

Turning now to FIG. 7, illustrated is a cross-sectional view of the partially completed semiconductor device 200 illustrated in FIG. 6 after subjecting the semiconductor device 200 to a standard source/drain anneal, thereby activating source/drain regions 710. It is believed that a source/drain anneal conducted at a temperature ranging from about 1000° C. to about 1350° C. and a time period ranging from about 1 millisecond to about 5 seconds would be sufficient. It should be noted that other temperatures, times, and processes could be used to activate the source/drain regions 710.

Additionally illustrated in FIG. 7 is the formation of a silicidation metal 720 over the exposed portions of the source/drain regions 710 as well as over the gate structure 230. As shown, the silicidation metal 720 may cover the entire surface of the partially completed semiconductor device 200. The silicidation metal 720 in the embodiment shown in FIG. 7 happens to be a thin cobalt layer, however, other materials that react with silicon to form a silicide could easily be used. For instance it is known that the silicidation metal 720 may also comprise nickel, platinum, titanium, tantalum, molybdenum, tungsten, another similar metal, or any combination thereof while staying within the scope of the present invention.

The silicidation metal 720 may be formed using a number of different processes, and may be formed to a number of different thicknesses. In one embodiment of the invention the silicidation metal 720 is deposited to a thickness ranging from about 3 nm to about 15 nm. Such thicknesses, however, might be used when the silicidation metal 720 comprises cobalt. Various other thicknesses could be used if the silicidation metal 720 were to comprise one of the different metals disclosed above.

Figure 8:
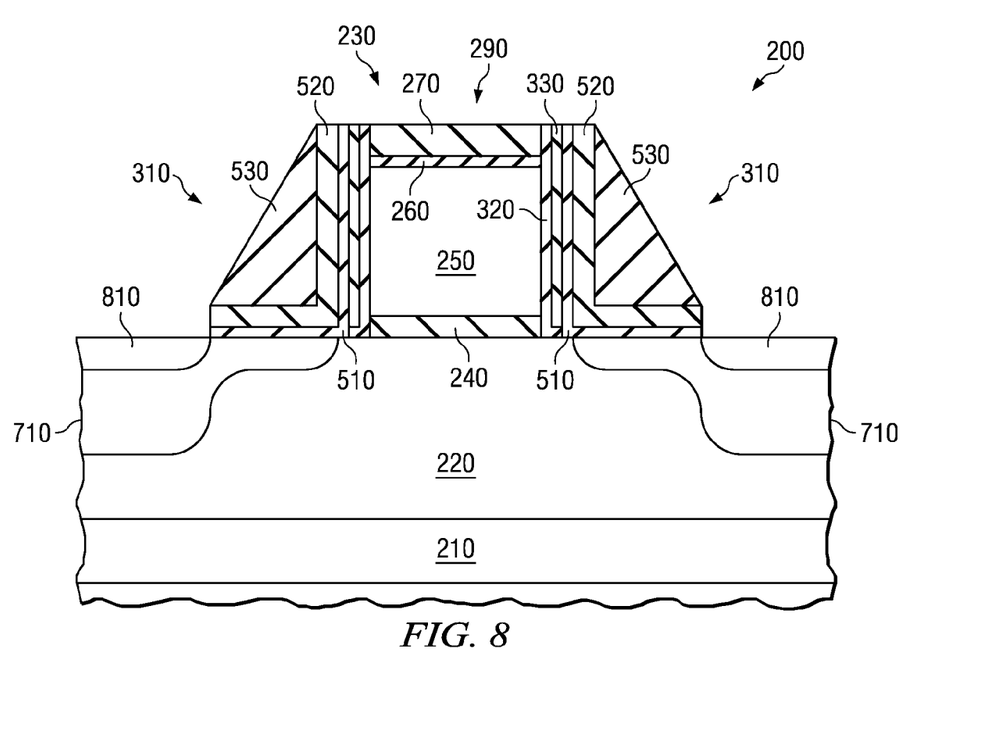
FIG. 8 illustrates a cross-sectional view of the partially completed semiconductor device illustrated in FIG. 7 after subjecting it to a rapid thermal anneal (RTA)

Turning now to FIG. 8, illustrated is a cross-sectional view of the partially completed semiconductor device 200 illustrated in FIG. 7 after subjecting it to a rapid thermal anneal (RTA). This RTA attempts to cause the silicidation metal 720 to react with the silicon of the source/drain regions 710 to form silicided source/drain regions 810. In the instance where the silicidation metal 720 comprises nickel, the RTA causes the nickel to react with the silicon to form a nickel silicide.

The RTA may be conducted using a variety of different temperatures and times. Nonetheless, it is believed that the RTA, in an exemplary embodiment, should be conducted in a rapid thermal processing tool at a temperature ranging from about 350° C. to about 550° C. and a time period ranging from about 10 second to about 100 seconds to accomplish the silicidation when nickel is used. The specific temperature and time period are typically based, however, on the ability to form the silicided source/drain regions 810 to a desired depth, as well as the silicide materials selected.

A selective wet etch, using for example a mixture of sulfuric acid (H$_2$SO$_4$), hydrogen peroxide (H$_2$O$_2$) and water (H$_2$O), may then be used to remove un-reacted silicidation metal 720 on regions other than exposed silicon, such as on sidewall of the gate structure 230. Additionally, another optional RTA step may be used to form a low resistivity phase of the silicide. In the case of using a cobalt silicidation metal, the first RTA forms CoSi, while the optional RTA forms CoSi$_2$, which has lower resistivity and is more stable. This optional RTA step is typically performed using a temperature ranging from about 650° C. to about 800° C. for a time period ranging from about 5 to about 60 seconds. Nevertheless, the embodiment disclosed herein uses nickel for the silicidation metal.

Figure 9:
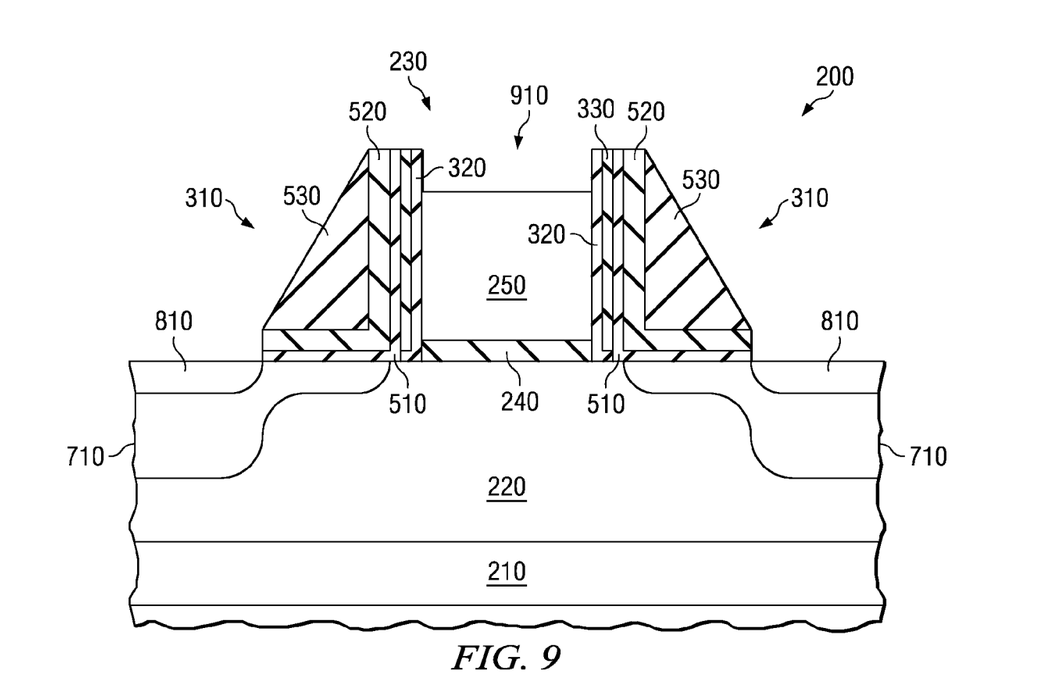
FIG. 9 illustrates a cross-sectional view of the partially completed semiconductor device illustrated in FIG. 8 after removing both the protective layer and buffer layer from over the polysilicon gate electrode layer to form an opening.

Turning now to FIG. 9, illustrated is a cross-sectional view of the partially completed semiconductor device 200 illustrated in FIG. 8 after removing both the protective layer 270 and buffer layer 260 from over the polysilicon gate electrode layer 250 to form an opening 910. Unique to the present invention, the etchant used to remove the protective layer 270 does not substantially affect other structures or films, including the buffer layer 260. More specifically, the hot phosphoric acid etchant used to remove the protective layer 270 does not affect the L-shaped nitride spacer 520 and silicided source/drain regions 810. Even though the protective layer 270 and the L-shaped nitride spacer 520 both comprise silicon nitride, the carbon content of the L-shaped nitride spacer 520 provides substantial protection from the etchant.

In an advantageous embodiment of the present invention, the etchant used to remove the protective layer 270 is highly selective to the buffer layer 260. Accordingly, this etchant does not substantially affect the buffer layer 260, and more importantly, does not substantially affect the polysilicon gate electrode layer 250. Moreover, the etchant used to remove the buffer layer 260 is highly selective to the polysilicon gate electrode layer 250. For example, when the buffer layer 260 comprises a thin oxide layer, a dilute hydrofluoric acid deglaze could be used to remove the thin oxide layer with limited, if any, damage to the polysilicon gate electrode layer 250. Those skilled in the art appreciate that the specific etch chosen for the buffer layer 260, as well as that chosen for the protective layer 270, is highly dependent on the materials for each and the etch selectivities for each.

Figure 10:
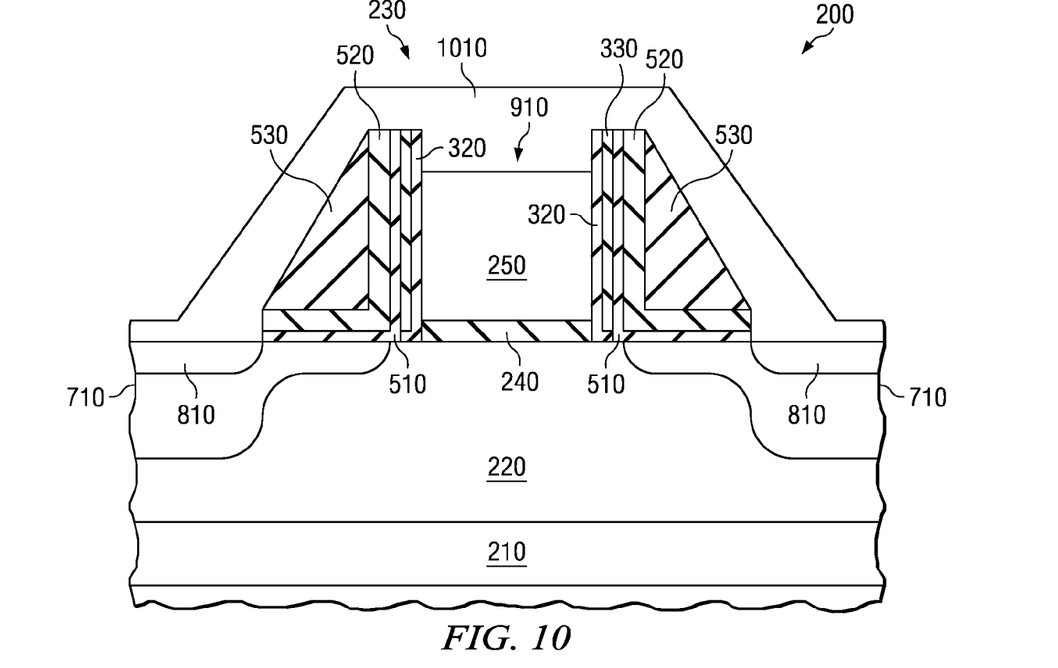
FIG. 10 illustrates a cross-sectional view of the partially completed semiconductor device illustrated in FIG. 9 after depositing a second silicidation metal over the exposed portions of the polysilicon gate electrode layer, as well as over the remainder of the semiconductor device.

Turning now to FIG. 10, illustrated is a cross-sectional view of the partially completed semiconductor device 200 illustrated in FIG. 9 after depositing a second silicidation metal 1010 over the exposed portions of the polysilicon gate electrode layer 250, as well as over the remainder of the semiconductor device 200. In a preferred embodiment, the silicidation metal 1010 is designed to fully silicidize the polysilicon gate electrode layer 250. As it takes approximately 1 nm of nickel to fully silicidize approximately 1.8 nm of polysilicon, the thickness of the silicidation metal 1010 should be at least 56% of the thickness of the polysilicon gate electrode layer 250. To be comfortable, however, it is suggested that the thickness of the silicidation metal 1010 should be at least 60% of the thickness of the polysilicon gate electrode layer 250. Thus, where the thickness of the polysilicon gate electrode layer 250 ranges from about 50 nm to about 150 nm, as described above, the thickness of the silicidation metal 1010 should range from approximately 30 nm to about 90 nm. It should also be noted that the silicidation metal 1010 might comprise a number of different metals or combinations of metals while staying within the scope of the present invention. For example, the silicidation metal 1010 may comprise any metal known to react with polysilicon to form a metal silicide.

In an alternative embodiment of the invention, a thinner layer of silicidation metal 1010 may be formed over the exposed portions of the polysilicon gate electrode layer 250, as well as over the remainder of the semiconductor device 200. In this instance, the thinner layer of silicidation metal 1010 will only react with the top portion of the polysilicon gate electrode layer 250, to form a partially silicided gate electrode. The thickness of the thinner layer of silicidation metal 1010 could range from about 3 nm to about 15 nm to only partially silicide the silicided gate electrode. This embodiment is particularly useful for applications where a poly-gate oxide interface is used, rather than a silicide-gate oxide interface, as is the case in the fully silicided gate electrode discussed directly above.

Figure 11:
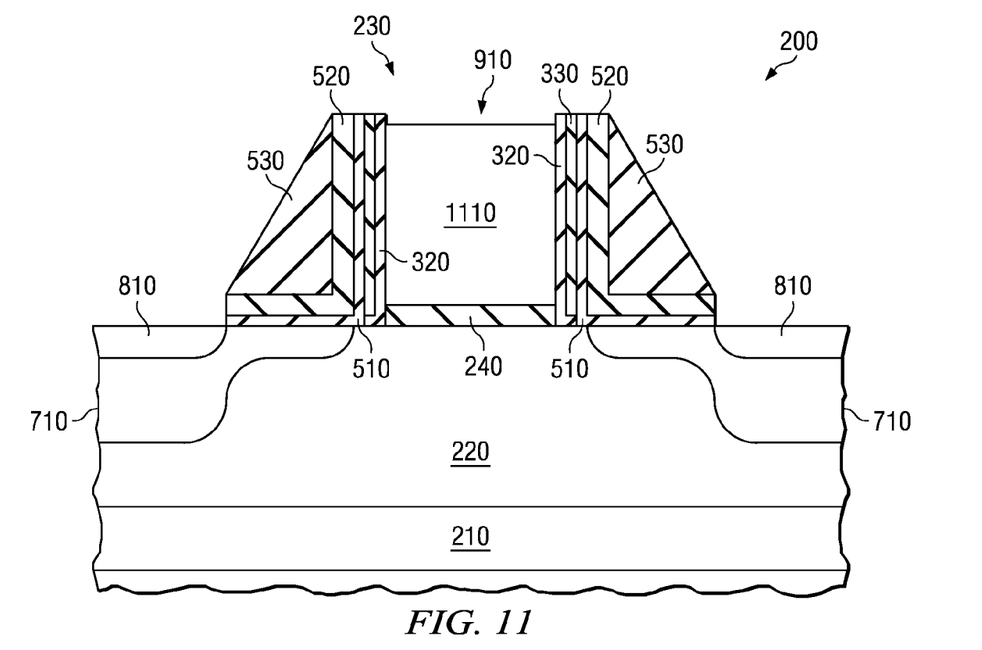
FIG. 11 illustrates the partially completed semiconductor device illustrated in FIG. 10 after converting the polysilicon gate electrode layer to a silicided gate electrode.

Turning now to FIG. 11, illustrated is the partially completed semiconductor device 200 illustrated in FIG. 10 after converting the polysilicon gate electrode layer 250 to a silicided gate electrode 1110. Those skilled in the art understand the steps that might be required to form the silicided gate electrode 1110, including subjecting the polysilicon gate electrode layer 250 and metal silicide layer 1010 to another RTA. This RTA is designed to convert the polysilicon gate electrode layer 250 to the silicided gate electrode 1110. The annealing temperature depends on the silicidation metal being used. For example, it is believed that the RTA may be conducted at a temperature ranging from about 350° C. to about 550° C. and a time period ranging from about 10 second to about 100 seconds to accomplish the silicidation when nickel is used. It should be noted that other temperatures, times, and processes could be used if another metal were used. In a preferred embodiment, the silicidation metal 1010 fully silicidizes the polysilicon gate electrode layer 250. The silicide, however, does not form on the source/drain region 710 at this time because of the silicided source/drain regions 810.

After completing the silicided gate electrode 1110, the partially completed semiconductor device 200 may be subjected to a selective removal process. For instance, in one embodiment of the invention the device could be subjected to an etch recipe consisting of sulfuric acid (H$_2$SO$_4$), hydrogen peroxide (H$_2$O$_2$) and water (H$_2$O). This specific etch recipe has a high degree of selectivity and could easily remove any remaining portions of the silicidation metal 1010. Thereafter, the manufacture of the partially completed semiconductor device 200 would continue in a conventional manner, optimally resulting in a device similar to the semiconductor device 100 illustrated in FIG. 1. It should be noted that the exact order of the steps illustrated with respect to FIGS. 2-11 might change depending on the process flow. Additionally, various other steps could be added to the description of FIGS. 2-11.

The method of manufacturing the semiconductor device as discussed with respect to FIGS. 2-11 provides many benefits over the prior art methods. First, and possibly most important, it uses the buffer layer to protect the polysilicon gate electrode layer from the negative effects of the protective layer and the etch used to remove it. For example, the intentional growth of the buffer layer makes the chemical/layer condition between the polysilicon gate electrode layer and the protective layer much more controllable. Additionally, the buffer layer will separate the protective layer from the polysilicon gate electrode layer during subsequent thermal and mechanical processes, thereby reducing chemical and mechanical interactions between them. Further, the dilute hydrofluoric acid solution used to remove the buffer layer produces a consistent and clean polysilicon gate electrode layer surface. Without the buffer layer, the polysilicon gate electrode layer surface may be chemically non-uniform and mechanically strained. Accordingly, the polysilicon gate electrode layer, when converted to the silicided gate electrode, gets better and more consistent silicidation. This, in turn, helps the electrical stability of the semiconductor device.

Second, the method of manufacturing the semiconductor device as discussed with respect to FIGS. 2-11 separates the formation of the silicided gate electrode and silicided source/drain regions (e.g., silicided source/drain contact regions) into different steps. Advantageously, this allows the depth of the silicided source/drain regions (e.g., silicided source/drain contact regions) to be independent of the thickness of the silicided gate electrode. The decoupling of the two steps is achieved by taking advantage of the selectivity of chemical reactions on the exposed surface. Accordingly, CMP is not needed, as it is in the prior art methods capable of decoupling the steps. As such, the method of the present invention is applicable to devices having different step heights, whether by design or process variation. The CMP technique of the prior art is not capable of accepting such variations in step heights. Further, the method of the present invention allows the semiconductor device to easily choose different silicidation metals for the silicide gate electrode and silicided source/drain regions (e.g., silicided source/drain regions).

It should also be noted that the method for manufacturing a semiconductor device as illustrated in FIGS. 2-11 represents only one embodiment of the present invention. For instance, other embodiments exist where the silicided source/drain regions 810 are not formed until after siliciding the polysilicon gate electrode layer 250 to form the silicided gate electrode 1110. In this instance, both the silicided source/drain regions 810 and the silicided gate electrode 1110 might use nickel rather than both nickel and cobalt. Nevertheless, those skilled in the art understand the steps that could be used to accomplish this, as well as the steps used to accomplish other variations of that which is currently claimed.

Figure 12:
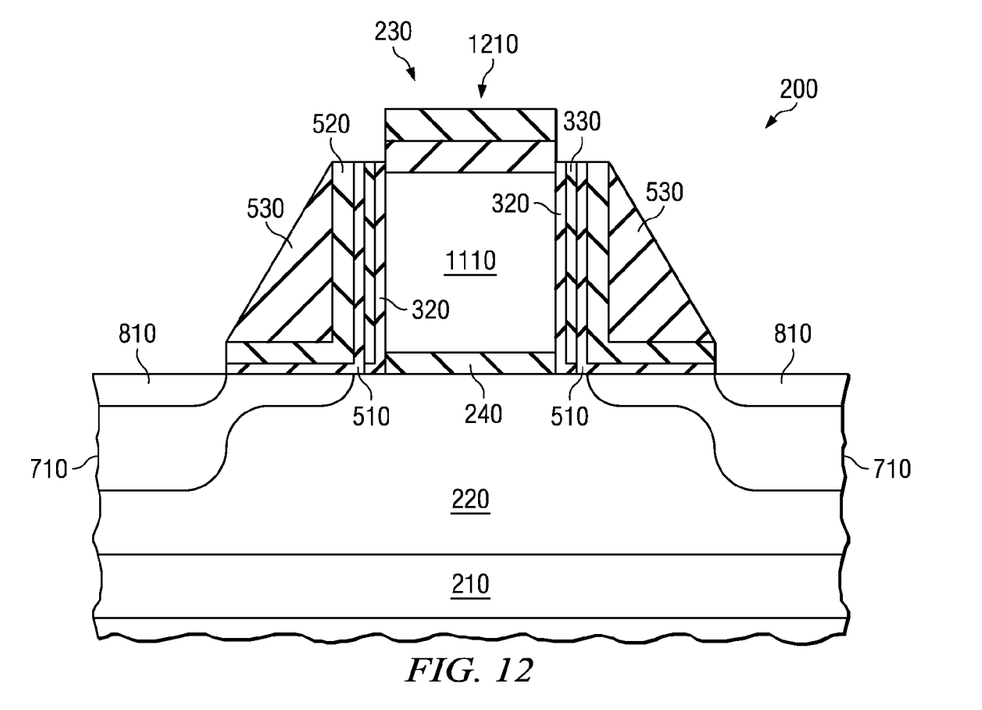
FIG. 12 illustrates a cross-sectional view of an embodiment of the present invention wherein the method of manufacturing semiconductor devices as discussed with respect to FIGS. 2-11 is applied to fabricate a high performance stacked capacitor.

Turning briefly to FIG. 12, illustrated is a cross-sectional view of an embodiment of the present invention wherein the method of manufacturing semiconductor devices as discussed with respect to FIGS. 2-11 is applied to fabricate a high performance stacked capacitor 1210. Using the process sequences described above, the first electrode (or the bottom electrode) of the capacitor 1210 can be fully silicided. Subsequently, the insulator over the first electrode and the second electrode can be formed using conventional methods. Due to the elimination of the poly depletion at the interface between the first electrode and gate oxide by full silicidation, the performance of the stacked capacitors is enhanced. More details pertaining to the stacked capacitor may be obtained from U.S. patent application Ser. No. 10/722,013, entitled "A CAPACITOR FORMED ON A RECRYSTALIZED POLYSILICON LAYER AND A METHOD OF MANUFACTURE THEREFOR" by Jiong-Ping Lu, et al., which is incorporated herein by reference.

Figure 13:
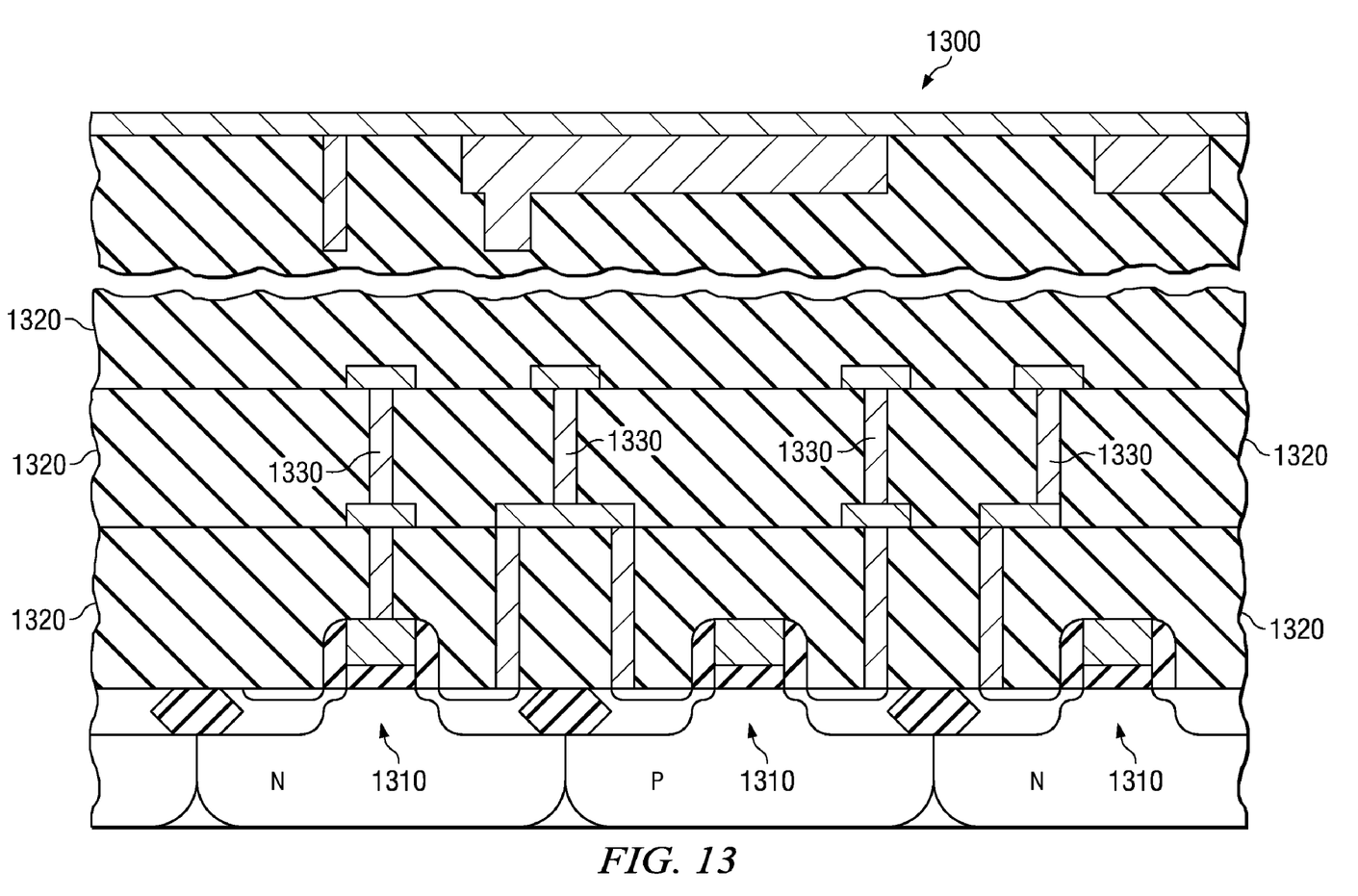
FIG. 13 illustrates an exemplary cross-sectional view of an integrated circuit (IC) incorporating devices constructed according to the principles of the present invention.

Referring now to FIG. 13, illustrated is an exemplary cross-sectional view of an integrated circuit (IC) 1300 incorporating devices 1310 constructed according to the principles of the present invention. The IC 1300 may include devices, such as transistors used to form CMOS devices, BiCMOS devices, Bipolar devices, as well as capacitors or other types of devices. The IC 1300 may further include passive devices, such as inductors or resistors, or it may also include optical devices or optoelectronic devices. Those skilled in the art are familiar with these various types of devices and their manufacture. In the particular embodiment illustrated in FIG. 13, the IC 1300 includes the devices 1310 having dielectric layers 1320 located thereover. Additionally, interconnect structures 1330 are located within the dielectric layers 1320 to interconnect various devices, thus, forming the operational integrated circuit 1300.

Figure 14:
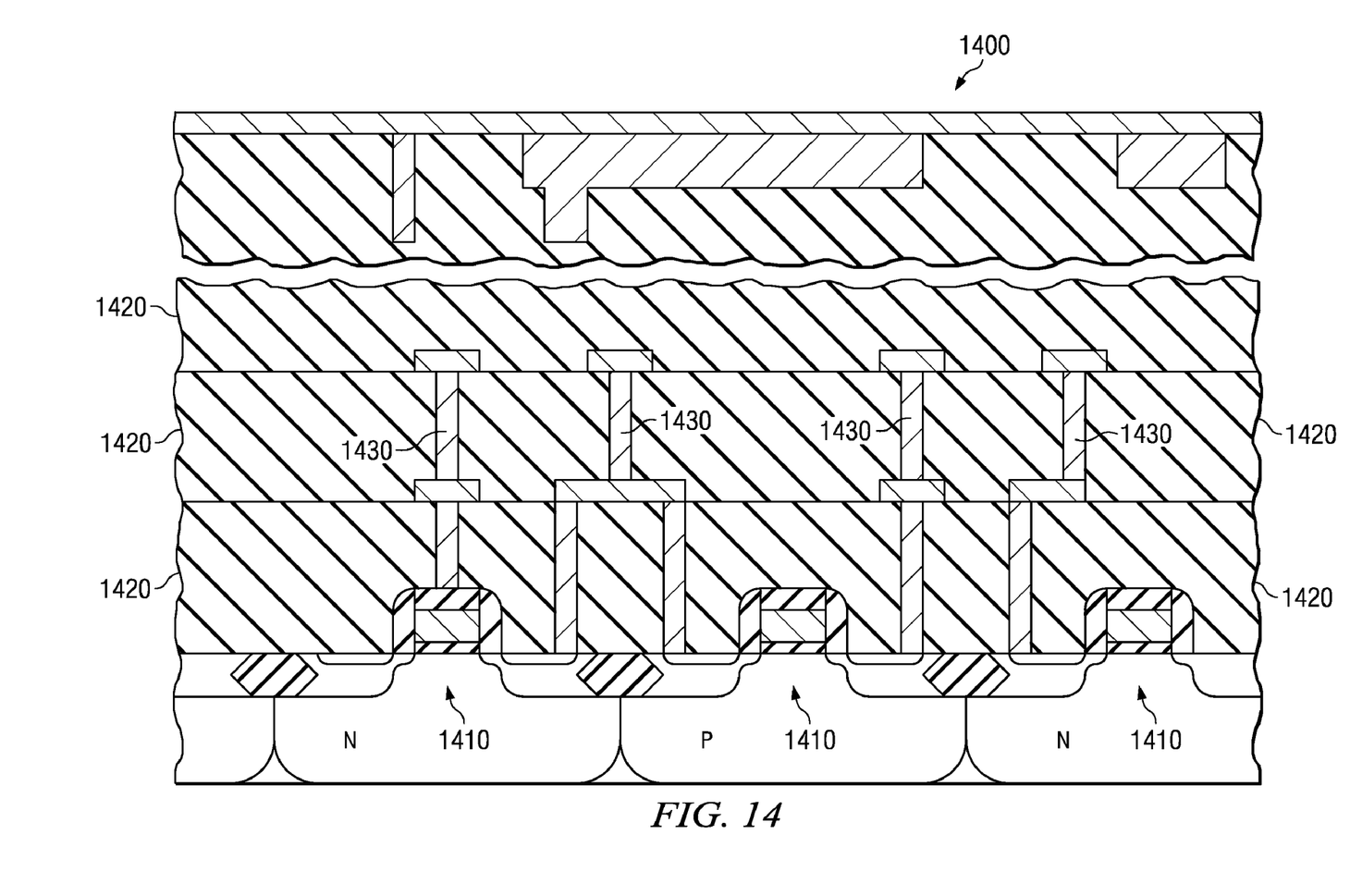
FIG. 14 illustrates another exemplary cross-sectional view of an integrated circuit (IC) incorporating devices constructed according to the principles of the present invention.

Referring finally to FIG. 14, illustrated is another exemplary cross-sectional view of an integrated circuit (IC) 1400 incorporating devices 1410 constructed according to the principles of the present invention. In the particular embodiment illustrated in FIG. 14, the IC 1400 includes devices 1410 having a gate electrode that is only partially silicided. The partially silicided gate electrode is desirable to reduce contact resistance of the poly electrode while keeping the poly-gate oxide interface without a silicide forming at the interface. Located over the devices 1410 are dielectric layers 1420. Additionally, interconnect structures 1430 are located within the dielectric layers 1420 to interconnect various devices, thus, forming the operational integrated circuit 1400.

Although the present invention has been described in detail, those skilled in the art should understand that they can make various changes, substitutions and alterations herein without departing from the spirit and scope of the invention in its broadest form.

What is claimed is:

1. A method for manufacturing a semiconductor device, comprising:
   providing a capped polysilicon gate electrode over a substrate, the capped polysilicon gate electrode including:
   gate sidewalls, each sidewall comprising a first oxide layer, an offset nitride spacer, a cap oxide layer, a L-shaped nitride spacer and an oxide spacer, and
   a buffer layer located between a polysilicon gate electrode layer and a protective layer;
   forming source/drain regions in the substrate proximate the capped polysilicon gate electrode;
   removing the protective layer by a first etch process, wherein a first etchant used in the first etch process is selective to the buffer layer;
   removing the buffer layer by a second etch process, wherein a second etchant used in the second etch is selective to the polysilicon gate electrode including the gate sidewalls; and
   siliciding the polysilicon gate electrode layer to form a silicided gate electrode.

2. The method as recited in claim 1 wherein the buffer layer comprises an oxide.

3. The method as recited in claim 2 wherein removing the buffer layer includes removing the buffer layer using a solution of hydrofluoric acid.

4. The method as recited in claim 1 wherein the buffer layer comprises a material selected from the group consisting of SiC, SiOC, SiON, SiCN, or combinations thereof.

5. The method as recited in claim 1 wherein the buffer layer has a thickness ranging from about 0.5 nm to about 1.0 nm.

6. The method as recited in claim 1 further including siliciding the source/drain regions to form silicided source/drain regions prior to removing the protective layer and the buffer layer.

7. The method as recited in claim 1 wherein the protective layer is a silicon nitride protective layer.

8. The method as recited in claim 1 wherein the silicided gate electrode is a nickel silicided gate electrode.

9. The method as recited in claim 1 wherein siliciding the polysilicon gate electrode layer to form a silicided gate electrode includes fully siliciding the polysilicon gate electrode layer to form a fully silicided gate electrode.

10. The method as recited in claim 1 wherein the buffer layer is located directly on the polysilicon gate electrode layer and the protective layer is located directly on the buffer layer.

11. A method for manufacturing an integrated circuit, comprising:
   forming semiconductor devices over a substrate, including:
      providing a capped polysilicon gate electrode over a substrate, the capped polysilicon gate electrode including:
         gate sidewalls, each sidewall comprising a first oxide layer, an offset nitride spacer, a cap oxide layer, a L-shaped nitride spacer and an oxide spacer, and
         a buffer layer located between a polysilicon gate electrode layer and a protective layer;
      forming source/drain regions in the substrate proximate the capped polysilicon gate electrode;
      removing the protective layer by a first etch process, wherein a first etchant used in the first etch process is selective to the barrier layer;
      removing the buffer layer by a second etch process, wherein a second etchant used in the second etch is selective to the polysilicon gate electrode including the gate sidewalls; and
      siliciding the polysilicon gate electrode layer to form a silicided gate electrode; and
   forming interconnects within dielectric layers located over the substrate for electrically contacting the semiconductor devices.

12. The method as recited in claim 11 wherein the buffer layer comprises an oxide.

13. The method as recited in claim 12 wherein removing the buffer layer includes removing the buffer layer using a solution of hydrofluoric acid.

14. The method as recited in claim 11 wherein the buffer layer comprises a material selected from the group consisting of SiC, SiOC, SiON, SiCN, or combinations thereof.

15. The method as recited in claim 11 wherein the buffer layer has a thickness ranging from about 0.5 nm to about 10 nm.

16. The method as recited in claim 11 further including siliciding the source/drain regions to form silicided source/drain regions prior to removing the protective layer and the buffer layer.

17. The method as recited in claim 11 wherein the protective layer is a silicon nitride protective layer.

18. The method as recited in claim 11 wherein the silicided gate electrode is a nickel silicided gate electrode.

19. The method as recited in claim 11 wherein siliciding the polysilicon gate electrode layer to form a silicided gate electrode includes fully siliciding the polysilicon gate electrode layer to form a fully silicided gate electrode.

20. The method as recited in claim 11 wherein the buffer layer is located directly on the polysilicon gate electrode layer and the protective layer is located directly on the buffer layer.

* * * * *